(12) United States Patent
Walk (10) Patent No.: US 7,335,979 B2
(45) Date of Patent: Feb. 26, 2008

(54) DEVICE AND METHOD FOR TILTED LAND GRID ARRAY INTERCONNECTS ON A CORELESS SUBSTRATE PACKAGE

(75) Inventor: Michael J. Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,154

(22) Filed: Jun. 28, 2004

(65) Prior Publication Data

US 2005/0285255 A1 Dec. 29, 2005

(51) Int. Cl.
*H01L 23/12* (2006.01)
*H01L 23/04* (2006.01)

(52) U.S. Cl. .............. 257/700; 257/785; 257/E23.078

(58) Field of Classification Search ................ 257/700
See application file for complete search history.

(56) References Cited

U.S. PATENT DOCUMENTS

| | | | |
|---|---|---|---|
| 4,740,700 A * | 4/1988 | Shaham et al. ............. 250/332 |
| 5,847,390 A * | 12/1998 | Long et al. .................. 250/332 |
| 5,947,749 A | 9/1999 | Rathburn |
| 6,083,557 A * | 7/2000 | Belcher et al. ............. 427/497 |
| 6,114,221 A * | 9/2000 | Tonti et al. .................. 438/455 |
| 6,220,870 B1 * | 4/2001 | Barabi et al. ................. 439/71 |
| 6,247,938 B1 | 6/2001 | Rathburn |
| 6,250,933 B1 | 6/2001 | Khoury et al. |
| 6,437,591 B1 | 8/2002 | Farnworth et al. |
| 6,534,723 B1 * | 3/2003 | Asai et al. ................... 174/255 |
| 6,586,684 B2 * | 7/2003 | Frutschy et al. ............. 174/260 |
| 6,669,489 B1 * | 12/2003 | Dozier et al. ................. 439/71 |
| 6,916,181 B2 | 7/2005 | Brown et al. |
| 7,154,176 B2 * | 12/2006 | Huang et al. ................ 257/737 |
| 2001/0024890 A1 | 9/2001 | Maruyama et al. |
| 2002/0121689 A1 * | 9/2002 | Honda .......................... 257/700 |
| 2005/0104223 A1 * | 5/2005 | Huang et al. ................ 257/779 |
| 2005/0181655 A1 | 8/2005 | Haba et al. |

OTHER PUBLICATIONS

"cLGA Land Grid Array Socket System: Product Description", http://www.lgasockets.com/desc/default.htm, (2003), 3 pages.

Corbin, J. S., "Land grid array sockets for server applications", *IBM J. Res. & Dev.*, vol. 46, No. 6, (Nov. 2002), 763-778.

* cited by examiner

*Primary Examiner*—Evan Pert
*Assistant Examiner*—Ben P Sandvik
(74) *Attorney, Agent, or Firm*—Schwegman, Lundberg & Woessner, P.A.

(57) ABSTRACT

An article of manufacture and system, as well as fabrication methods therefore, may include a plurality of lands disposed on a surface of a substrate wherein the lands are oriented at an angle to the surface of the substrate and further wherein the substrate is formed of conductive layers that are formed such that a non-conductive layer does not interpose between the conductive layers and their coupling.

20 Claims, 7 Drawing Sheets

DEVICE AND METHOD FOR TILTED LAND GRID ARRAY INTERCONNECTS ON A CORELESS SUBSTRATE PACKAGE

RELATED APPLICATION

This disclosure is related to pending U.S. patent application Ser. No. 10/880,419, titled "TILTED LAND GRID ARRAY PACKAGE AND SOCKET, SYSTEMS, AND METHODS," filed on an even date herewith, and assigned to the assignee of the embodiments disclosed herein, Intel Corporation.

TECHNICAL FIELD

Various embodiments described herein relate to packaging generally, including apparatus, systems, and methods used for substrate packages and interconnections between packages.

BACKGROUND

As electronic circuit chips become increasingly thinner to accommodate a new generation of consumer electronic devices, such as PDA, cell phones and the like, their mechanical ability to withstand the steps of fabrication necessary to form them may be diminished.

Several methods are known to decrease the sensitivity of such devices to such conditions by increasing their rigidity. Unfortunately, in making the devices more robust in terms of rigidity, the devices may be thicker.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

In the following detailed description of embodiments of the invention, reference is made to the accompanying drawings which form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that logical, mechanical, and electrical changes may be made without departing from the spirit and scope of the present disclosure. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of the present disclosure is defined only by the appended claims.

The term substrate generally refers to a physical structure or layer that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting materials, or combinations of semiconducting and non-semiconducting materials.

Relative direction terms as used in this description are defined with reference to the conventional horizontal, large plane or surface of a board, such as a motherboard, where electrical components have typically been attached, regardless of the orientation of the board. Likewise, when referring to components that are adapted for use on circuit boards, terms such as "top surface" or "bottom surface" are defined as surfaces of components that are substantially parallel to the conventional horizontal, large plane or surface of the board. The term "vertical" refers to a direction perpendicular to the horizontal as defined above.

Coreless substrate is a substrate where the reinforcing core layer(s) with through holes have been omitted. Typically, glass is used as reinforcement in a core layer, though other stiffening materials, such as carbon fibers, can be used. Typically, thermoset materials such as epoxy are used as the matrix/resin for the reinforcement. However other polymer materials such as polyimids or thermoplastics can also be used. Typically, through holes are used for making an electrical interconnection between the layers on both sides of the core layer, though other interconnect techniques can be used. It is to be understood that any arrangement where a plurality of layers are directly coupled without the interposing of a reinforcing core layer or its equivalent with through holes is considered to be a coreless substrate.

Figure 1A:
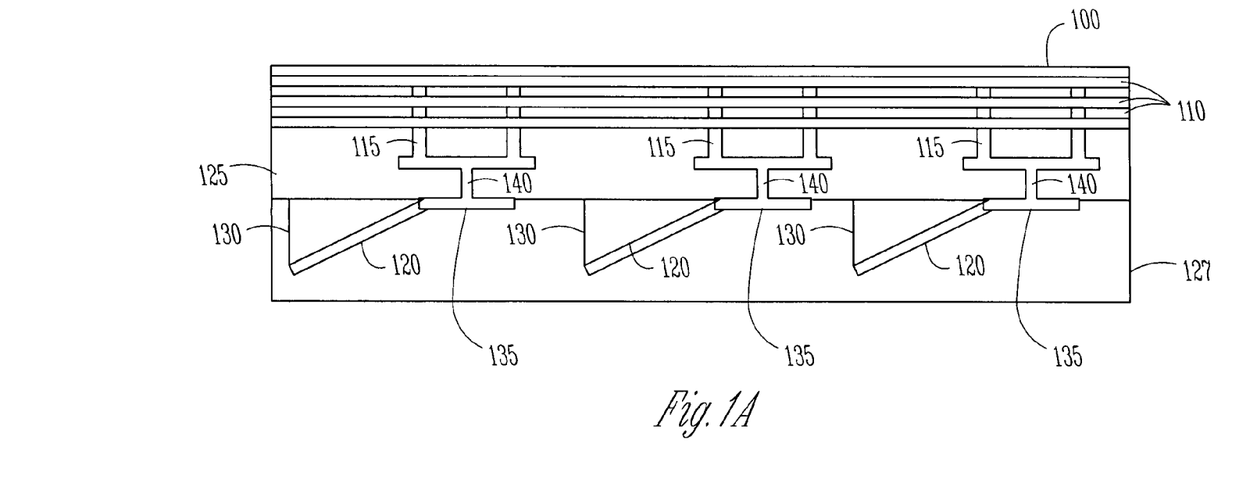
FIG. 1A is a side view of an apparatus according to various embodiments.

FIG. 1A is a side elevation view of a substrate according to an embodiment of the inventive subject matter described herein. The substrate 100 has a plurality of conductive layers 110, a plurality of conductive paths 115 through the plurality of conductive layers 110, and a plurality of lands 120. In an embodiment, the plurality of conductive layers 110 includes one or more layers of patterned conductive material. In an embodiment, the conductive material is some other suitably conductive material. In an embodiment, the plurality of conductive layers 110 includes one or more layers of patterned conductive material separated by one or more layers of dielectric material. The plurality of conductive layers 110 are electrically interconnected through conductive paths 115 which could include vias, trenches or other vertical connections. In an embodiment, the conductive path couples at least one of the plurality of lands 120 to at least one of the plurality of conductive paths on the at least one of the plurality of conductive layers 110. In an embodiment, the plurality of conductive layers 110 comprises at least two layers where the first layer is directly coupled to the second layer without the interposing of a reinforcing core layer. Such an arrangement of conductive layers 110 without a reinforcing core layer interposed between them is known in the art as a coreless substrate. Traditionally, a thick- or thin-core substrate includes a reinforcing core layer interposed between at least two of the conductive layers, which provides rigidity to the substrate such that the substrate is capable of withstanding deflection and warpage during subsequent fabrication steps and use. In an embodiment, the substrate of FIG. 1A lacks such a reinforcing core layer.

FIG. 1A further shows an additional layer 125 disposed below the plurality of conductive layers 110. In an embodiment, the layer 125 is a stiffener layer capable of providing mechanical rigidity to the substrate. In an embodiment, the layer 125 is a glass reinforced epoxy. In an embodiment, the layer 125 is a ceramic. In an embodiment, the layer 125 is any suitable non-conductive material. On this layer 125 are formed features 130 on which the plurality of conductive lands 120 are disposed. A plurality of features 130 are formed such that their conductive lands 120 are oriented at an angle to the surface of the layer 125. The plurality of lands 120 are coupled to the at least one conductive layer 110 by a plurality of pads coupled to the plurality of lands 120, a plurality of plated through holes 140 coupled to the plurality of pads and a plurality of vias 115 coupled to at least one of the plurality of layers 110. In an embodiment, the plurality of vias 115 further couple the plurality of layers 110.

Figure 1B:
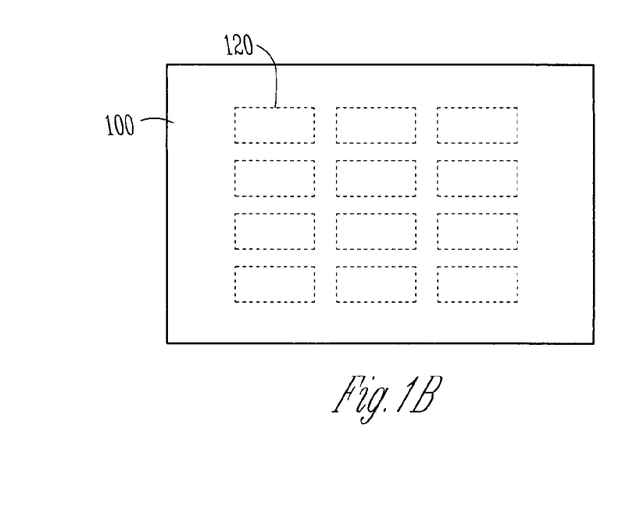
FIG. 1B is a bottom view of an apparatus according to various embodiments.

FIG. 1B is a bottom view of the substrate depicted in FIG. 1A. The conductive lands 120 are shown disposed in a 4×3 arrangement on the surface of the substrate 100, though any logical arrangement of conductive lands may be used.

Figure 1C:
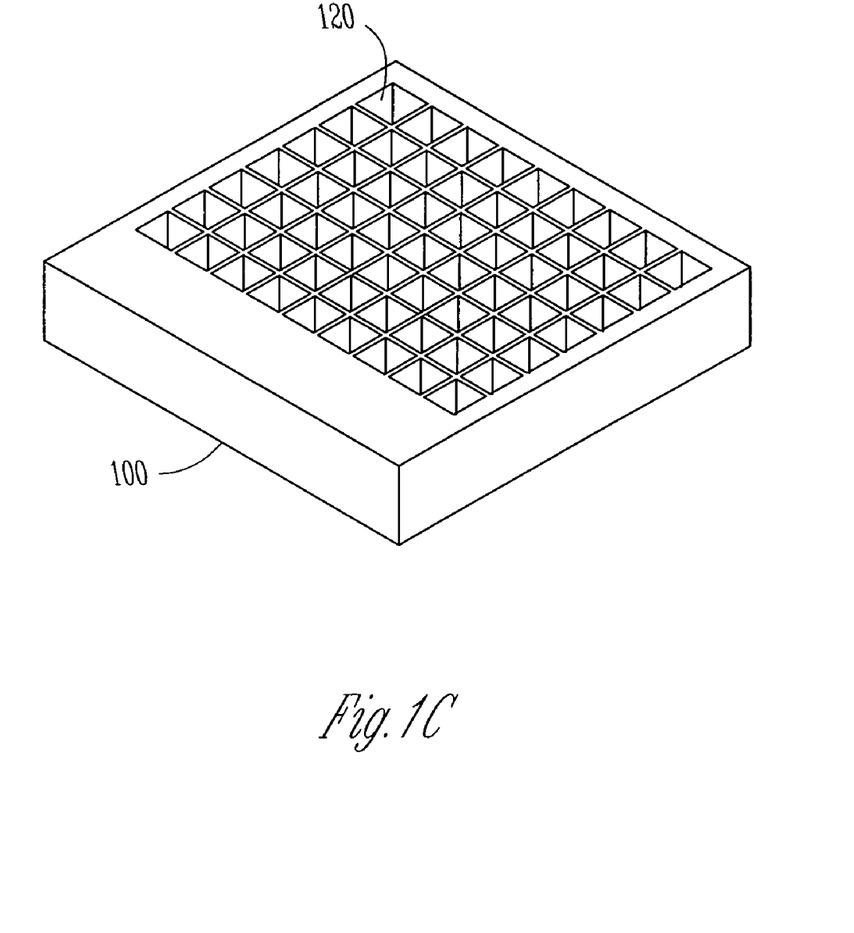
FIG. 1C is an isometric view of an apparatus according to various embodiments.

FIG. 1C is a perspective view of the substrate depicted in FIG. 1A. The plurality of conductive lands 120 are shown disposed in an arrangement on the surface of the substrate 100. FIG. 1C shows that the conductive lands 120 are oriented at an angle to the bottom surface of the substrate 100. FIG. 1C further shows that the conductive lands 120 lie wholly below the bottom surface of the substrate 100. In an embodiment, the conductive lands 120 lie wholly above the bottom surface of the substrate 100. In an embodiment, some portion of the conductive land 120 lies below the bottom surface of the substrate 100 while the remaining portion of the conductive land 120 lies above the bottom surface of the substrate 100.

Figure 2:
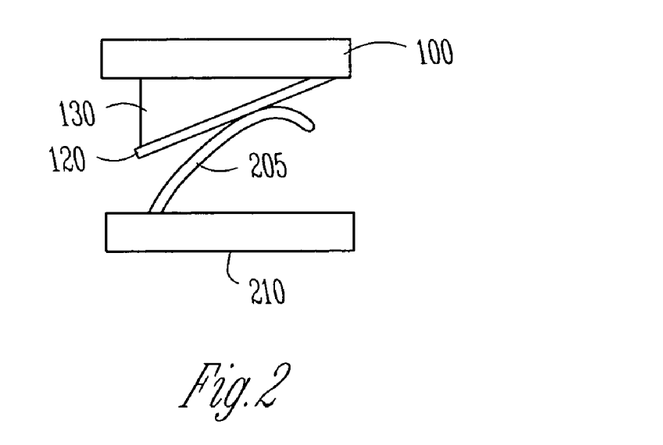
FIG. 2 is a side view of an apparatus according to various embodiments.

FIG. 2 is a side detail of a land 120 and a feature 130 showing a contact 205 engaging the conductive land 120. The conductive lands 120 are disposed on the surface of the feature 130 and coupled to the substrate 100 and provide an electrical interconnection between the substrate 100 and the socket 210 when the substrate 100 is engaged with the socket 210. The socket 210 has a plurality of contacts 205 arranged in an array substantially similar to the arrangement of conductive lands 120 on the bottom surface of the substrate 100. The plurality of contacts 205 engage the plurality of conductive lands 120 as the surface of the socket 210 is moved into proximity with the substrate 100, typically along an axis that is substantially perpendicular to the surfaces of the substrate 100 and the socket 210. As the substrate 100 and the socket 210 are moved into proximity with each other, the contact 205 conductively engages the conductive land 120. As the substrates are brought into closer physical proximity the contact 205 remains in contact with the conductive land 120.

The utility of providing a conductive land 120 that is oriented at an angle to the surface of the substrate 100 is exhibited when the substrates are moved into physical proximity such as described herein. Deflection of the contact 205 serves to optimize the interconnection between the contact 205 and the conductive land 120 and makes the interconnection less sensitive to misalignment of the substrates in the horizontal plane. Traditional arrangements where the land 120 is disposed substantially parallel to the surface of the substrate 100 lends to increased stress on the contacts 205. Further, if the substrate 100 has experienced warpage, the contacts 205 will not fully engage the conductive lands 120. Additionally, if any misalignment occurs as the substrates are moved into physical proximity the contacts 205 may not fully engage the conductive lands 120.

In an embodiment, if the substrate 100 is warped due to fabrication or any other reason, the contact 205 can engage the conductive land 120 along any point such that close physical proximity between the substrate 100 and the socket 210 is not required. In an embodiment, the contact 205 is capable of engaging the conductive land 120 at any point allowing for an electrical interconnection that is resistive to a substantially greater level of warpage in the substrate 100, deflection in the substrate 100 or misalignment in the horizontal plane of the substrates, than with traditional electrical interconnects. Though the contact 205 is shown as being above the surface of the socket 210, it will be understood by those skilled in the art that the contact is further coupled to an electrical interconnect on the socket 210 such that the land 120 is coupled to a terminal on a further device, such as a printed circuit board.

Figure 3:
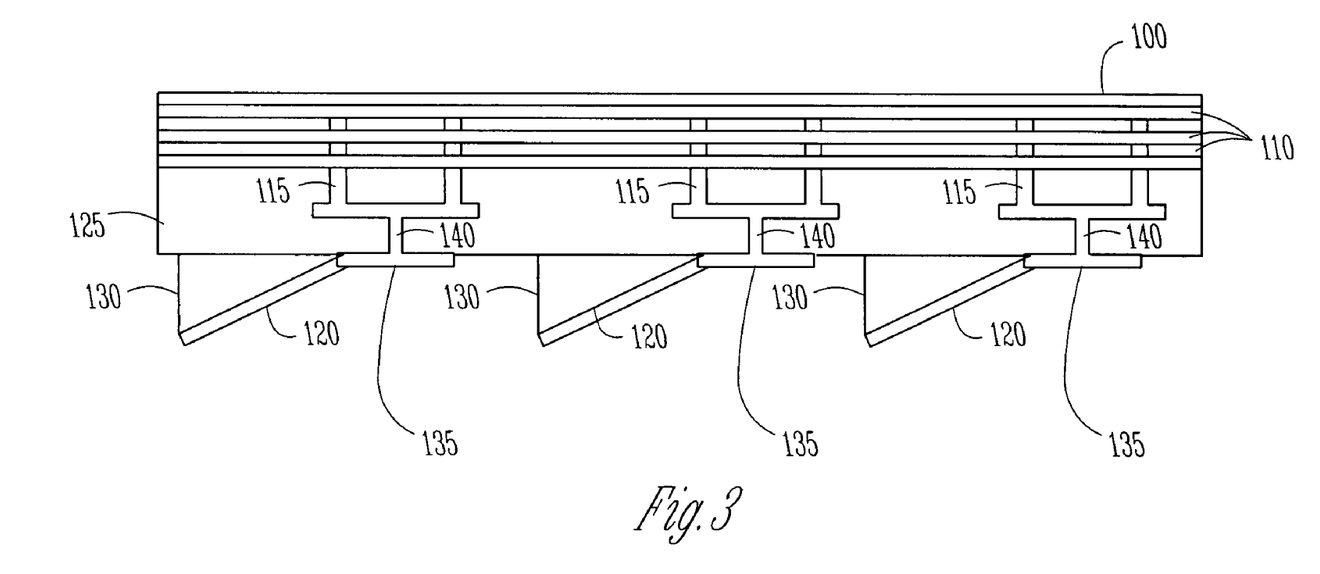
FIG. 3 is a side view of an apparatus according to various embodiments.

FIG. 3 shows an alternate embodiment of the inventive subject matter described herein. In FIG. 3, the conductive lands 120 disposed of on the features 130 are formed wholly above the surface of a bottom surface.

Figure 4:
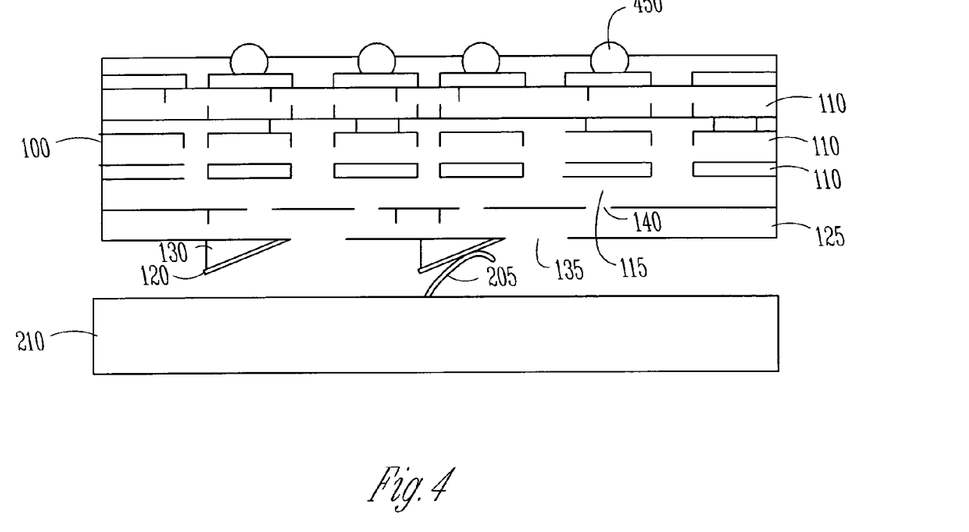
FIG. 4 is a side view of an apparatus according to various embodiments.

FIG. 4 is a side elevation view of a substrate 100 mated with a socket 210. The contacts 205 on the surface of the socket 210 have been brought into contact with the conductive lands 120 of the substrate 100. The substrate 100 has a plurality of layers 110 coupled to the conductive lands 120. Vias 115 provide a conductive path between the conductive lands 120 and the conductive layers 110 through a plurality of pads 440 and a plurality of plated through holes 445, formed in the non-conductive stiffener layer 125. It will be recognized in FIG. 4 that the engagement of the contact 205 to the conductive land 120 will be maintained in the event that the substrate 100 is warped or is deflected away from the surface of the socket 210 or otherwise misaligned. Contacts 450 are formed above the substrate 100 to provide a coupling between the substrate 100 and further devices when the subsfrate 100 is brought into further engagement with a further device such as a die.

Figure 5:
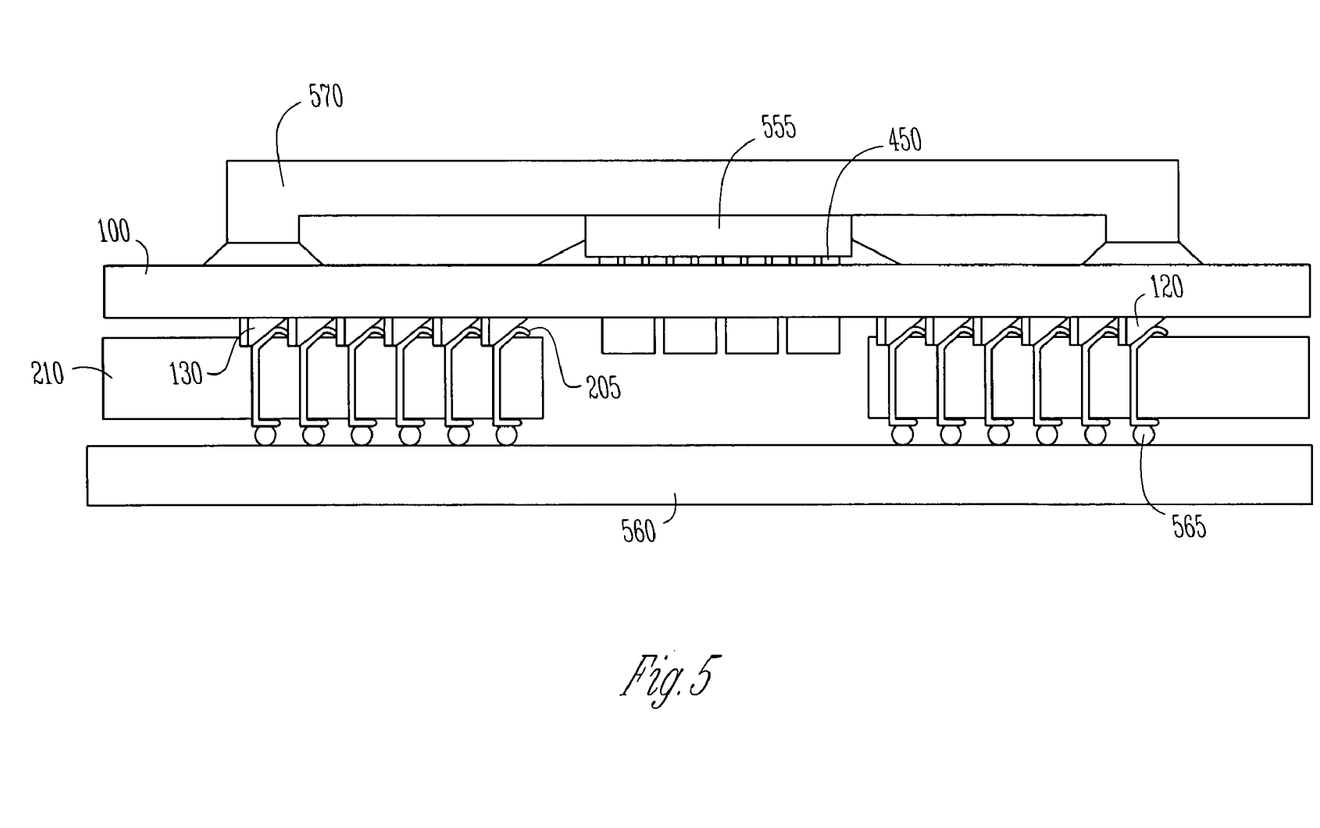
FIG. 5 is a side view of an apparatus according to various embodiments.

FIG. 5 is a side view of an electronic device according to an embodiment of the inventive subject matter described herein. A substrate 100 having a plurality of features 130 upon which conductive lands 120 are disposed is shown engaged with a socket 210 which has a plurality of contacts 205 that are arranged complementary to the array of the plurality of conductive lands 120. The socket 210 is shown further coupled to a printed circuit board 560 by a plurality of electrical interconnects 565, such as solder balls. Contacts 450 formed above the substrate 100 provide a coupling between the substrate 100 and an electrical device such as a die 555. Additionally, a heat sink 570 is thermally coupled to the surface of the substrate 100.

Figure 6:
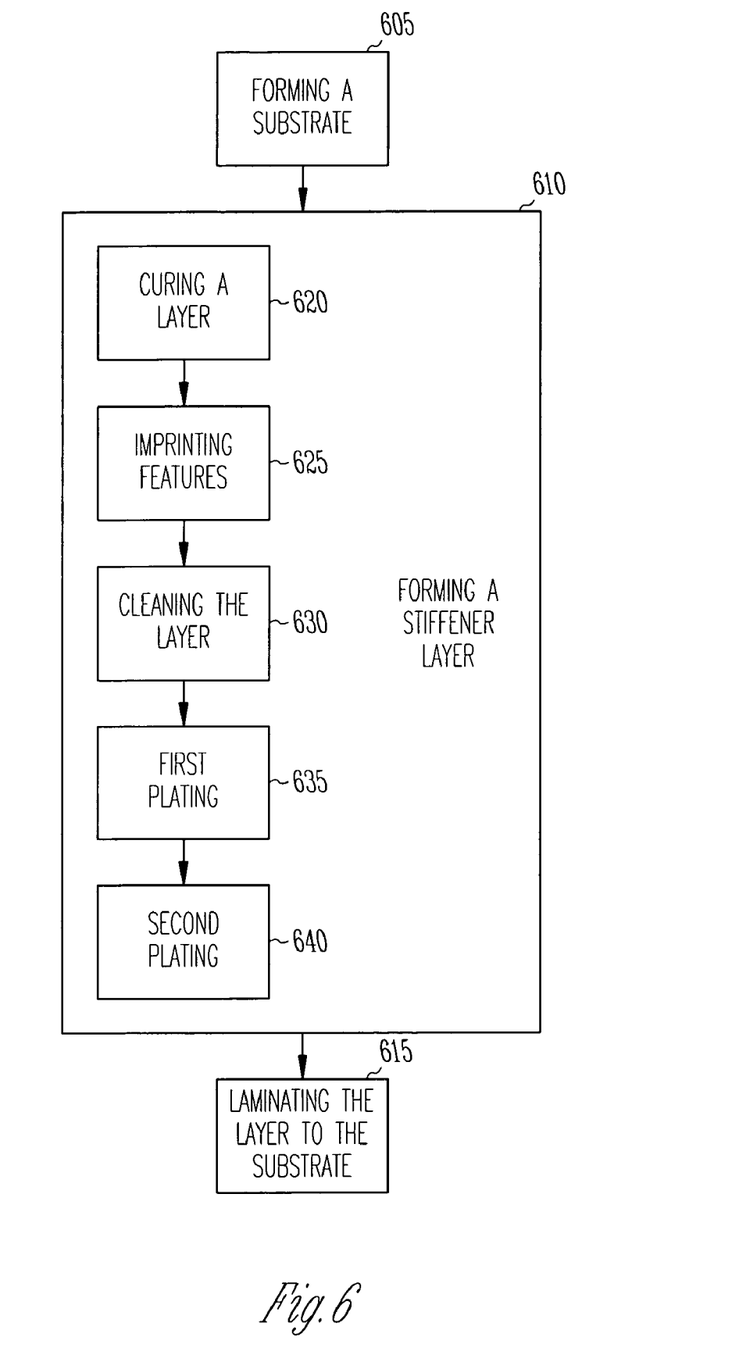
FIG. 6 is a flow chart illustrating a method according to various embodiments.

FIG. 6 shows an embodiment of a method of forming a coreless substrate with tilted land grid array (TLGA) contacts. In an embodiment, a coreless substrate is manufactured using conventional techniques at 605. A stiffener layer with lands oriented at an angle is formed at 610 and laminated onto a surface of the substrate at 615 using any suitable lamination process. In an embodiment, the layer is partially cured at 620 such that the layer is capable of retaining features during subsequent fabrication steps. In another embodiment, the layer is cured at 620 using a B stage cure such that the layer is capable of retaining features during subsequent fabrication steps. Features are imprinted on the layer at 625. In an embodiment the features are formed such that a surface of the feature is oriented at an angle to the surface of the layer. The material is cleaned at 630 after features are imprinted at 625. Features on the layer are first plated at 635. In an embodiment, the first plating is an electroless plating with copper. In an embodiment, the first plating plates any suitable conductive material to the feature. Features on the layer are second plated at 640. In an embodiment, the second plating is an electrolytic plating. Following the second plating at 640, the layer can then be laminated to the substrate at 615. In an embodiment, the layer is laminated onto a substrate that is of coreless manufacture.

Figure 7:
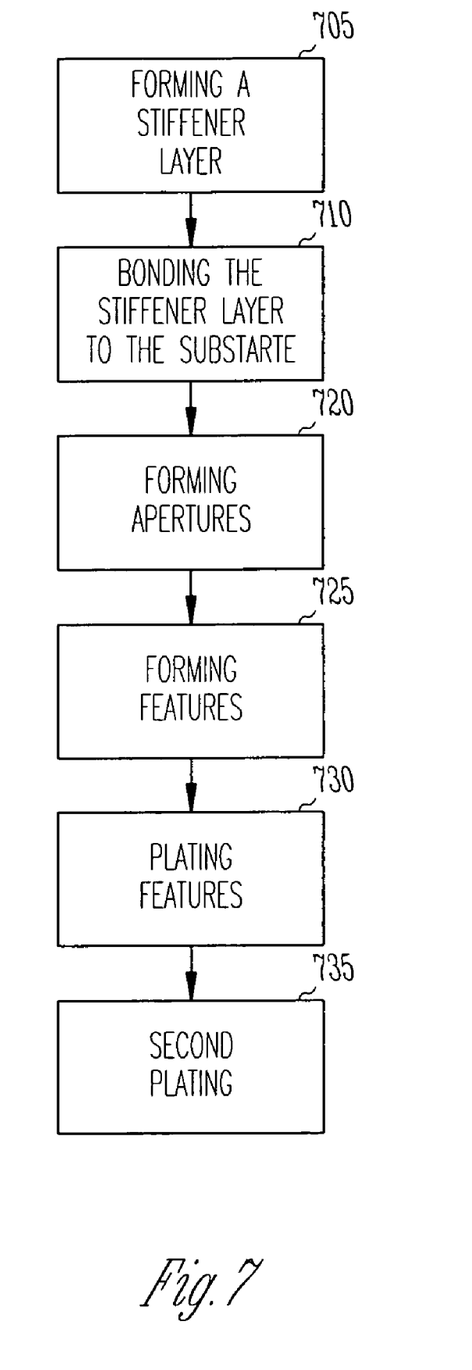
FIG. 7 is a flow chart illustrating a method according to various embodiments.

FIG. 7 shows an embodiment of forming a coreless substrate with TLGA contacts. In an embodiment, a stiffener layer is formed at 705 and bonded to a substrate at 710. In an embodiment, the stiffener layer is formed of glass reinforced epoxy. In an embodiment, the stiffener layer is formed of ceramic. In an embodiment, the stiffener layer is formed of any suitable non-conductive material. At 720, apertures are formed through the stiffener layer to the substrate, such that through holes are formed at 725. In an embodiment, the apertures are vias. Features are formed on a surface of the stiffener layer at 725. In an embodiment, features are formed at 725 by routing the stiffener layer. In an embodiment, features are formed at 725 by imprinting the stiffener layer. In an embodiment, the features are formed at 725 such that a surface of the features is oriented at an angle to the surface of the stiffener layer. At 730, the features are plated. In an embodiment, the features are plated at 730 using any suitable process sufficient to metalize the features. In an embodiment, the features are plated at 730 with copper. In an embodiment, the features are plated at 730 with any suitable conductive material. In an embodiment, the substrate is a substrate of coreless manufacture.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. An article of manufacture, comprising:
   a substrate having a plurality of conductive layers, and also having at least one conductive path from one of the conductive layers to a surface of the substrate, wherein the plurality of conductive layers also comprises:
   a first conductive layer;
   a second conductive layer directly coupled to the first conductive layer without the interposition of a reinforcing core layer;
   a further layer adhered to the substrate, wherein the further layer includes at least one feature in contact with the further layer and on a surface of the further layer, the at least one feature having disposed on a surface of the feature a generally planar conductive land, the surface of the feature and the generally planar conductive land oriented at an angle and tilted relative to the surface of the further layer, the generally planar conduct land contacting a pad at the surface of the further layer; and
   the pad coupled through a plated through hole and at least one via to at least one of the plurality of conductive layers; and
   a socket carrying at least one contact thereof to engage the at least one land, as the surface of the substrate is moved into proximity with the surface of the socket.

2. The article of claim 1, wherein the conductive path comprises at least one of a plurality of pads and at least one of a plurality of vias.

3. The article of claim 1, wherein the at least one land is a conductive land.

4. The article of claim 1, wherein the further layer is a stiffener layer.

5. The article of claim 4, wherein the stiffener layer is glass reinforced epoxy.

6. The article of claim 4, wherein the stiffener layer is ceramic.

7. The article of claim 4, wherein the stiffener layer is non-conductive.

8. An article of manufacture, comprising:
   a substrate having a plurality of conductive layers, and also having at least one conductive path from one of the conductive layers to a surface of the substrate, wherein the plurality of conductive layers also comprises:
   a first conductive layer;

a second conductive layer directly coupled to the first conductive layer without the interposition of a reinforcing core layer;

a further layer adhered to the substrate, wherein the further layer has arranged on a surface of the further layer at least one feature in contact with the further layer and on a surface of the further layer, the at least one feature having disposed on a surface of the feature a generally planar conductive land, the surface of the feature and the generally planar conductive land oriented at an angle and tilted relative to the surface of the further layer, the generally planar conduct land contacting a pad at the surface of the further layer; the pad coupled through a plated through hole and at least one via to at least one of the plurality of conductive layers; and an electronic device coupled to at least one of the conductive layers of the substrate; and a heat sink coupled to the substrate; and a socket carrying at least one contact thereof to engage the at least one land as the surface of the socket is moved into proximity with the surface of the substrate.

9. The article of claim 8, wherein the conductive path comprises at least one of a plurality of pads and at least one of a plurality of vias.

10. The article of claim 8, wherein the at least one land is a conductive land.

11. The article of claim 10, wherein the further layer is a stiffener layer.

12. The article of claim 10, wherein the stiffener layer is glass reinforced epoxy.

13. The article of claim 10, wherein the stiffener layer is ceramic.

14. The article of claim 10, wherein the stiffener layer is non-conductive.

15. The article of claim 8, wherein the electronic device is a die.

16. The article of claim 8, wherein the electronic device is an IC device.

17. An electronic system, comprising:

at least one printed circuit board;

at least one of a plurality of substrates, wherein the at least one substrate is coupled to the printed circuit board;

an arrangement of a plurality of contacts arranged on the at least one substrate;

a number of substrate packages, wherein the number of substrate packages corresponds to the plurality of sockets, wherein the substrate package comprises:

a plurality of conductive layers, wherein the plurality of conductive layers also comprises:

a first conductive layer;

a second conductive layer directly coupled to the first conductive layer without the interposition of a reinforcing core layer; and a plurality of electrical interconnects arranged on at least one of the number of substrate packages, the electrical interconnects including a further layer adhered to the at least one of a the number of substrate packages, wherein the further layer has arranged on a surface of the further layer at least one feature in contact with the further layer and on a surface of the further layer, the at least one feature having disposed on a surface of the feature a generally planar conductive land, the surface of the feature and the generally planar conductive land oriented at an angle and tilted relative to the surface of the further layer, the generally planar conduct land contacting a pad at the surface of the further layer; the pad coupled through a plated through hole and at least one via to at least one of the plurality of conductive, and wherein the plurality of electrical interconnects are arranged substantially similar to the contacts arranged on the socket.

18. The system of claim 17, wherein the at least one socket includes any suitable interconnect device capable of electrically connecting the socket to a substrate package mated to the socket.

19. The system of claim 17, wherein the land surface is wholly beneath the surface of the substrate package.

20. The system of claim 17, wherein the land surface is wholly above the surface of the substrate package.

* * * * *

UNITED STATES PATENT AND TRADEMARK OFFICE
CERTIFICATE OF CORRECTION

PATENT NO. : 7,335,979 B2  
APPLICATION NO. : 10/880154  
DATED : February 26, 2008  
INVENTOR(S) : Walk Page 1 of 1

It is certified that error appears in the above-identified patent and that said Letters Patent is hereby corrected as shown below:

In column 8, line 17, in Claim 17, before "the" delete "a".

In column 8, line 28, in Claim 17, delete "conductive," and insert -- conductive layers, --, therefor.

Signed and Sealed this

Fifth Day of August, 2008

JON W. DUDAS  
*Director of the United States Patent and Trademark Office*